US006404362B1

(12) United States Patent
York et al.

(10) Patent No.: US 6,404,362 B1
(45) Date of Patent: Jun. 11, 2002

(54) METHOD AND APPARATUS FOR REDUCING THE TIME REQUIRED FOR DECOMPRESSING COMPRESSED DATA

(75) Inventors: Kenneth Lindsay York; Thayer Lindsay York, both of Huntington Valley, PA (US)

(73) Assignee: Unisys Corporation, Blue Bell, PA (US)

( * ) Notice: Subject to any disclaimer, the term of this patent is extended or adjusted under 35 U.S.C. 154(b) by 0 days.

(21) Appl. No.: 09/399,658

(22) Filed: Sep. 21, 1999

(51) Int. Cl.[7] .............................. H03M 7/00; H03M 7/38
(52) U.S. Cl. .......................................... 341/106; 341/51
(58) Field of Search ............................. 341/51, 50, 95, 341/67, 65, 87, 106

(56) References Cited

U.S. PATENT DOCUMENTS

| 5,049,881 A | * | 9/1991 | Gibson et al. ............... 341/95 |
| 5,151,697 A | * | 9/1992 | Bunton ....................... 341/51 |
| 5,229,768 A | | 7/1993 | Thomas ...................... 341/51 |
| 5,373,290 A | * | 12/1994 | Lempel et al. ................ 341/51 |
| 5,389,922 A | * | 2/1995 | Seroussi et al. ............... 341/51 |
| 5,455,576 A | * | 10/1995 | Clark, II et al. .............. 341/50 |
| 5,455,943 A | * | 10/1995 | Chambers, IV ............... 341/51 |
| 5,525,982 A | * | 6/1996 | Cheng et al. .................. 341/51 |
| 5,805,086 A | * | 9/1998 | Brown et al. .................. 341/51 |

FOREIGN PATENT DOCUMENTS

| EP | 05732081 | 8/1993 |
| EP | 0688104 A2 | 12/1995 |
| WO | 94/03983 | 2/1994 |
| WO | 96/21283 | 7/1996 |
| WO | 98/04045 | 1/1998 |

OTHER PUBLICATIONS

Salomon D: "Data Compression: The Complete Reference" New York, NY: Springer, US, 1998 pp. 101–162, 357–360, XP002150106, Sections 3.9–2.12.
International Search Report dated Nov. 15, 2000.

* cited by examiner

Primary Examiner—Peguy JeanPierre
Assistant Examiner—Jean Bruner Jeanglaude
(74) Attorney, Agent, or Firm—John B. Sowell; Mark T. Starr

(57) ABSTRACT

In a data decompression system of the type having a self-compiling dictionary for building or replicating codes used for decoding incoming code values, there is provided a decoded string dictionary or memory for storing plural characters representing decoded strings. The decoded strings may be stored in a modified dictionary replacing string codes or stored in a separate variable length memory as blocks of characters having predetermined length and accessed using a finder memory. If the decoded string becomes too long to be stored in a fixed length memory, a conventional decoder dictionary may be used to reduce the size of the strings stored for direct access and read out to a recovered data stream.

20 Claims, 9 Drawing Sheets

AT THE COMPRESSOR
STREAM= -WED-WE-WEE-WEB-WET

| LONGEST STRING @ MISS | CODE FOR MISS STRING | STORE AS S+EXT CH. CODES | SEND CODE FOR LONGEST MATCH FOUND |
|---|---|---|---|
| - | | | |
| -W | 256 | -+W | - |
| WE | 257 | W+E | W |
| ED | 258 | E+D | E |
| D- | 259 | D+- | D |
| -WE | 260 | 256+E | 256 |
| E- | 261 | E- | E |
| -WEE | 262 | 260+E | 260 |
| E-W | 263 | 261+W | 261 |
| WEB | 264 | 257+B | 257 |
| B- | 265 | B+- | B |
| -WET | 266 | 260+T | 260 |
| T(END) | | T | T |

FIG. 1

16
AT THE DECOMPRESSOR

| STRING CODE RECEIVED | STORE(BUILD) IN S. DICT. S + EXT. CH. | | ASSIGNED CODE COUNT | CHARACTER OUTPUT |
|---|---|---|---|---|
| - | | | | - |
| W | - | W | 256 | W |
| E | W | E | 257 | E |
| D | E | D | 258 | D |
| 256 | D | - | 259 | - |
| E | 256 | E | 260 | W |
| | - | | | E |
| | W | | | |
| 260 | E | - | 261 | W |
| 261 | 260 | E | 262 | E |
| | - | | | - |
| | W | | | W |
| | E | | | E |
| 257 | 261 | W | 263 | E |
| | E | | | - |
| B | 257 | B | 264 | B |
| | W | | | |
| | E | | | W |
| 260 | B | - | 265 | E |
| T | 260 | T | 266 | B |
| | - | | | - |
| | W | | | W |
| | E | | | E |
| (END) | T | | | T |

FIG. 2

METHOD AND APPARATUS FOR REDUCING THE TIME REQUIRED FOR DECOMPRESSING COMPRESSED DATA

RELATED APPLICATIONS

The present invention relates to our copending U.S. application Ser. No. 09/364,427 filed Jul. 30, 1999 for a Method and Apparatus For Reducing The Time Required For Compressing Data and is incorporated by reference herein.

BACKGROUND OF THE INVENTION

1. Field of the Invention

The present invention relates to data compression systems. More particularly, the present invention relates to a loss-less data decompression system and a method and means for increasing the speed of decompressing a stream of coded data in systems that employ a self-building dictionary to store string codes and character codes.

2. Description of the Prior Art

Heretofore, loss-less data compression algorithms were known, as were the algorithms for decoding the compression codes generated at the data compressor. The best known loss-less data compression algorithms are adaptive and employ a string dictionary at the compressor and at the decompressor.

The compression system generates strings of characters and searches the dictionary for the longest string match that can be found in the dictionary, then outputs a string code for the longest string found. The longest string match is stored in the compression system dictionary with the extension character which produced the mismatch. The string stored in the dictionary is assigned the next highest string code by a code counter. The compression system also outputs single character codes when they appear as the longest match string.

The decompression system receives only codes for strings and/or single character codes. Lemple Ziv Welch (LZW) data compression systems output only character codes or longest matched string codes to a decompression system having a dictionary that is preferably initialized with all single character codes, so that only plural character string codes are initially searched and character codes are sent to the decompression system from the compressor system. For a discussion of LZW see A Technique for High-Performance Data Compression by Terry A. Welch; IEEE Computer Volume 17, Number 6, June 1984.

The LZW compressor stores each new entry in its dictionary as a last match string code plus an extension character code. However, the compressor sends to the decompressor the last match string code but not the extension character. The decompressor must be arranged one step behind the compressor and must buffer two sequential input codes. The previous string code received is paired with the first character of the next or new code to form an entry in the decompressor string dictionary.

The problem with this sequence of operations is that the string codes being received from the compression system become longer and comprise numerous smaller substring codes which must be decoded. It is not unusual for a long string code to represent over fifty characters (bytes) which comprise almost as many substring codes. To decode the fifty characters represented by such a long string code it is necessary to look in the dictionary and retrieve each subcode and its extension character until all substring codes have been decoded and exhausted. Only one extension character is outputted to the output data stream each time a substring code is expanded into a new substring and its extension character, thus, the decompression system from time-to-time may cycle numerous times decoding a long string code that has already been seen. It would be desirable to eliminate the time wasted in a decompression system to expand any plural character string more than once. Stated differently it would be desirable to retrieve a set of individual characters representative of any long string code that has already been seen without resorting to repetitiously expanding substring codes.

SUMMARY OF THE INVENTION

It is a principle object of the present invention to provide a method and means for decoding compressed data faster than was heretofore possible.

It is a principle object of the present invention to eliminate repetitious decoding of long string codes by expansion of substring codes in a decompression system.

It is an object of the present invention to eliminate decoding of most substrings in a long string code.

It is an object of the present invention to eliminate redundant decoding/expansion operations in data decompressors.

It is an object of the present invention to provide a fast access memory in which are stored all characters representative of a known or previously seen long string code.

It is another object of the present invention to provide a decoding system capable of decoding complete pages of compressed data stored on web sites as fast as the data can be downloaded to the decompression system.

It is another object of the present invention to provide a method and means for decoding pages of a book or catalogs as blocks of compressed data codes.

It is another object of the present invention to provide a dictionary-type decompressor capable of real-time video image speeds of decompression without extensive buffer memories.

According to these and other objects of the present invention a novel decompressor is provided with a dictionary comprising two parts. A string dictionary is employed to build or replicate compressed data in the form of string codes and extension characters. Also, a decoded string dictionary or memory is provided to store at the addresses represented by the string codes all of the characters representative of or contained in a received string code which may be accessed as a block of characters in a single cycle.

Each compressed input code in an input data string is converted to a pointer or an address used to access data in a decoded string dictionary and to transfer blocks of characters to a utilization device. If the block of information is not in the decoded string dictionary, logic means enable the decoder to decode the string for a first time and to store different forms of the decoded string in both the string dictionary and/or in the decoded string dictionary at the same code pointer or address.

BRIEF DESCRIPTION OF THE DRAWINGS

FIG. 1 is a compression table illustrating how a typical string of characters are processed to produce output codes at the compressor;

FIG. 2 is a decompression table illustrating how the output codes produced in FIG. 1 are processed to build a decoder dictionary and to recover the original string of characters compressed at the compression system;

DETAILED DESCRIPTION OF THE PREFERRED EMBODIMENTS

Figure 3:
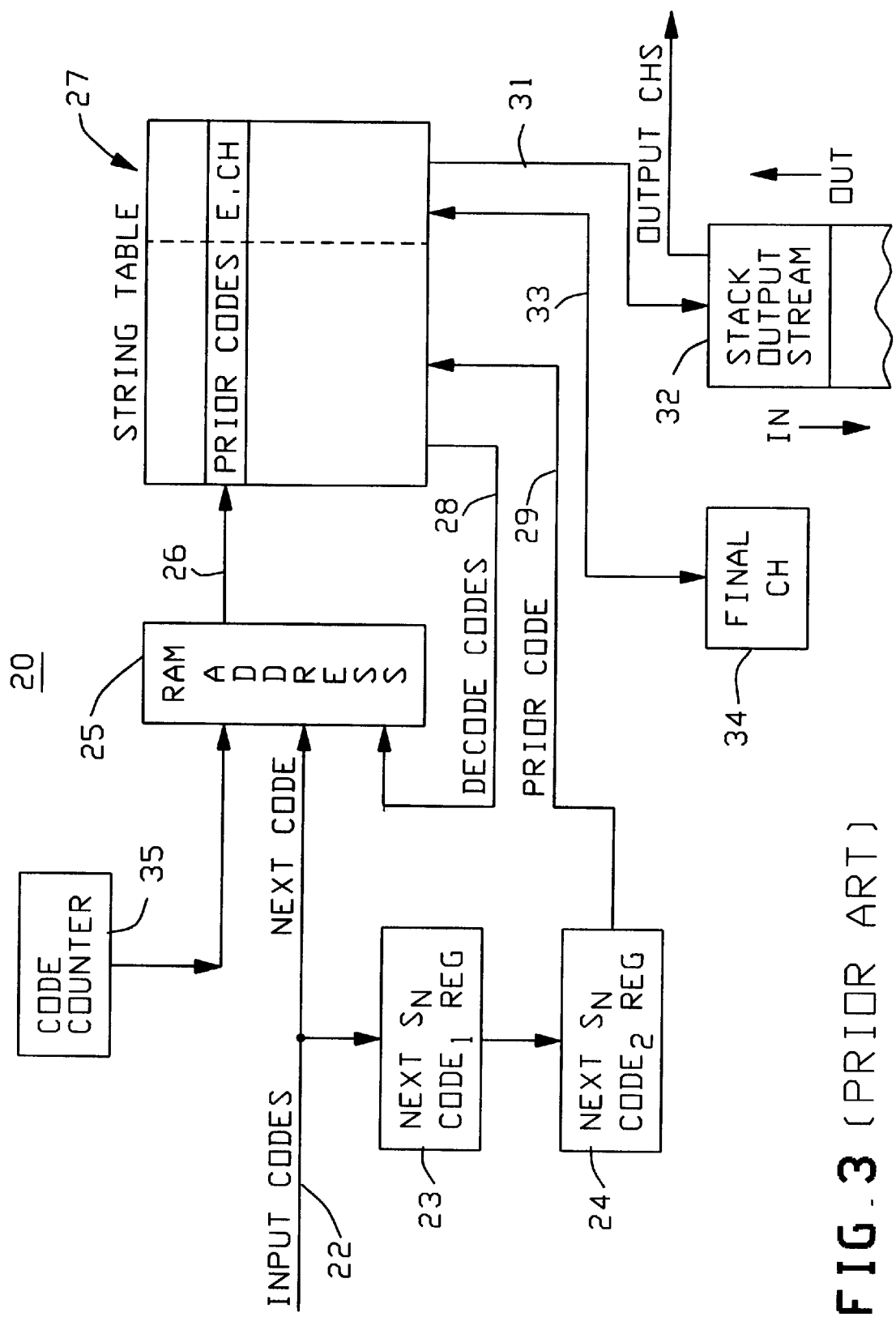
FIG. 3 is a block diagram of a prior art decompressor employed to explain the process of building a decoder dictionary and for explaining the recovery of individual characters which comprise the recovered and decoded original characters of a string.

Refer now to FIG. 1 and a compression table 10 showing a string of characters 11 to be compressed. The dash "-" between characters is a way of indicating a space between characters and is not a character to be encoded as a dash. Table 10 is shown having four vertical columns in which the left-most column 12 is a vertical column of the longest strings that occur in the string 11 before a miss occurs using Lempel Ziv Welch's data compression algorithm. For example, observing string 11 in which "-WED" occurs at the first four positions, the "-W" is the first string of characters which is not found in the dictionary which has been initialized with all of the single character strings or a string set using Lempel Ziv Welch compression algorithm. At the second row, the W that caused the mismatch is carried to the third row as the first character in the next string which is shown as WE. Each time a new string miss occurs the string is stored in the string dictionary at a new code address or code number. For example, -W is stored at code address 256 and WE is stored at code address 257 in column 13. The characters shown in column 14 are stored in the string dictionary as strings plus an extension character. The prefix string W at code 257 represents the longest match found in the dictionary and is outputted to a decompressor or utilization device as shown at column 15. When the last set of characters or character occurs as shown in the last row it includes a T. The T is the end of the string of characters 11 and is stored in the dictionary as a character or code for a character and is outputted as the last character T.

Having explained a simplified sequence of operations that occur at the compressor it will be noted that the decompressor to be explained hereinafter will reproduce the column 14 characters stored as strings plus extension characters even though only the code addresses shown in column 15 are being received.

Refer now to FIG. 2 showing a decompressor table 16 having four vertical columns. The leftmost vertical column 17 represents the sequence or series of individual codes in column 15 received at the decompressor from the compressor. The vertical column 18 represents the code number generated by a code counter at the time the code receive is being written into the dictionary. Vertical column 19 represents the string and the extension character being written in the dictionary at the numbered code count shown to the left of column 19. The rightmost column 22 is the output character or characters that are generated when decoding the string S shown in column 19. It will be observed that when each of the characters or strings are received at the decompressor in column 17 the first character is inserted in the dictionary as the extension character as shown in column 19 and is assigned a code count as shown in column 18. The prefix string S in column 19 represents the character or string which was the previously received and shown in column 19. If the code counts 256 through 260 are compared with the information being stored in the decompression dictionary, it will be observed that it is identical to the information stored in column 14 of the compressor dictionary as shown in FIG. 1. Thus, any time a code is received in column 17 it may be looked up in the decompressor string dictionary by its received code count and decoded by using the information shown in column 19. For example, if the code 256 is received as shown in the fifth row of column 17 it is known to be in the decompressor dictionary at code count 256 and the information or characters are -W which coincides with the compression dictionary. It will also be observed that the codes or characters received in column 17 contain the extension characters for the present code count and form the prefix stringcode used with an extension character for the previous code count. Thus, with a single exception which will be discussed hereinafter, the decompression system is capable of reproducing the exact strings shown in column 14 of the compressor in FIG. 1. After constructing the string dictionary in the decompressor it is possible to decode the prefix string S portion in column 19 and to output the prefix string S to reproduce the identical input string 11 in column 22 as an output.

Refer now to FIG. 3 showing a block diagram of a prior art decompressor that was used in the Terry Welch publication (supra)to explain the process of building a decoder dictionary and for explaining the recovery of the individual characters of the received string codes.

The decompressor 20 is shown having an input line 22 which receives the input codes to the decompressor. The input code is shown being stored in the register 23 as the next string Sn. The string which was previously Sn is shown being placed in the last or previous code register 24 which stores the string Sp or previous string. In the operation of the decompressor 20 the string Sn on line 22 is coupled to a RAM address generator 25 which produces a pointer address on line 26 into the string table 27. The code address produces a decoded first character code on line 28 which is used to produce the extension character to be stored in the rightmost portion of string table 27 as an extension character. The last or previous string Sp in register 24 supplies the prior string code on line 29 which is stored as a prefix in the leftmost portion of string table 27 at the code address produced by the code counter 35.

The code Sp in register 24, now stored in string table 27, is also decoded to produce an output string of characters in reverse order on line 31 which are placed in output stack 32. When the last character is detected or sensed on line 33 in block 34 this ends the decoding sequence for the string Sp.

The string Sp in stack 32 may now be read out of stack 32 in its proper order shown in column 21.

Having explained a prior art sequence of operations using FIG. 3 it will be noted that the string dictionary 27 is supplied information at the address indicated by the input code on lines 22 and 26, however, the characters placed in stack 32 in reverse order are representative of the last or previous codes Sp. Thus, the decoding process is one step or code count behind the dictionary code count. If the previous code Sp is a string of substrings and extension characters then decoding Sp comprises expanding all substrings and placing the extension characters into stack 32 until the final character of Sp (eg the first character) is detected at block 34.

Figure 4:
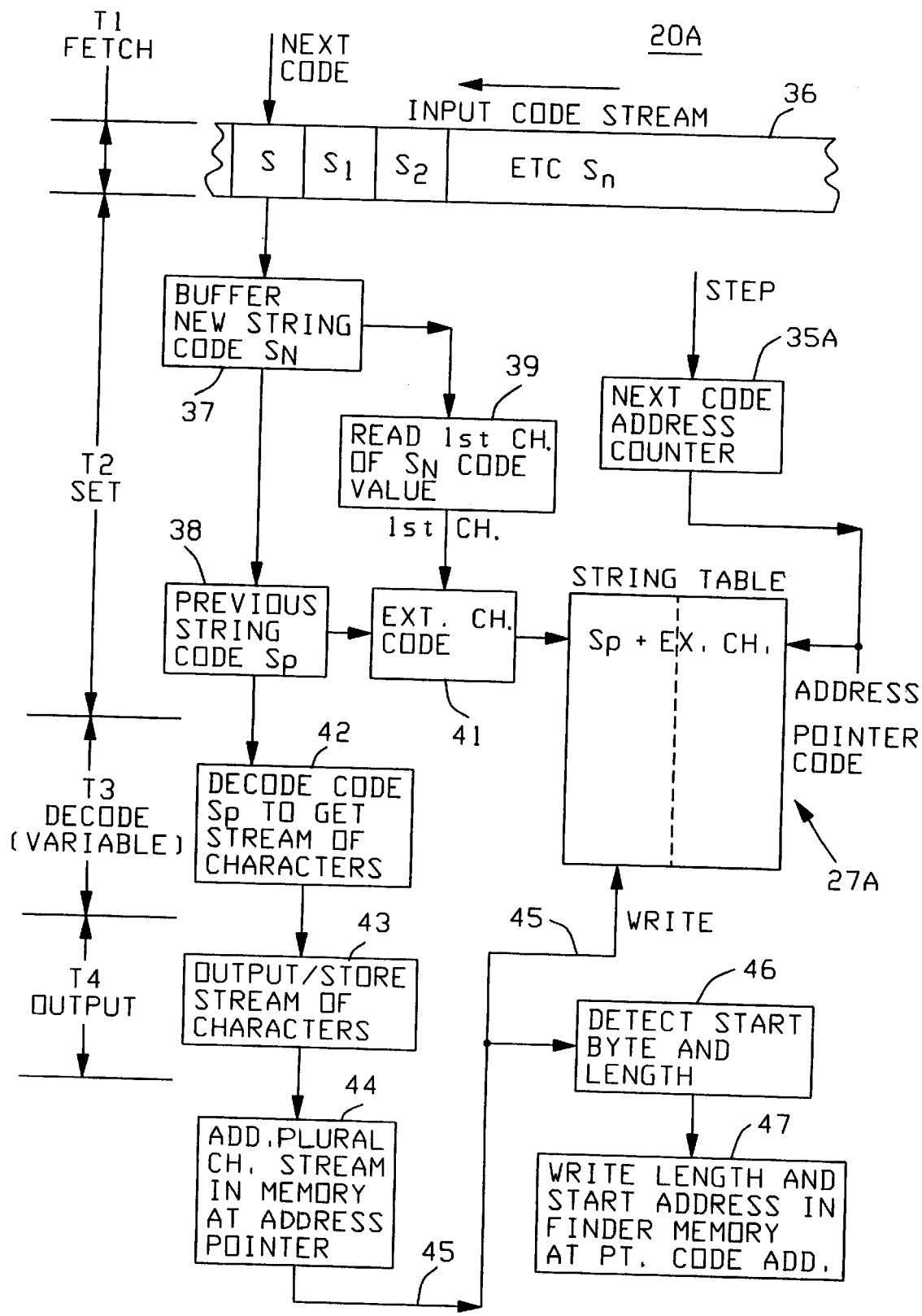
FIG. 4 is schematic block diagram of a generic present invention decompressor which is employed to explain the process of building a decoder dictionary and for storing decoded string codes.

Refer now to FIG. 4 showing a schematic block diagram of a generic decompressor according to the present invention which is employed to explain the process of building a decoder dictionary and for storing decoded string codes. The improved decoder 20A is shown having an input string of code values 36 which supply to buffer register 37 the next code Sn. String code Sn after being used is moved into the previous string register 38. The first character of the string Sn in register 37 is shown being read by logic block 39 and supplied to the block 41 which receives the extension character to be stored in the string table 27A as the rightmost extension character at the pointer address generated by the next code address counter 35A. It will be observed that the time taken to fetch the string and place it in buffer 37 is noted as time T1 and the time taken for setting the buffers 37 and 38 is shown as time T2 and both of these times are fixed for the system being considered. When the string Sp is decoded as shown in logic block 42, this time is shown as T3 as a variable because any particular code Sp maybe a long string of codes and will contain subcodes which require reference to the string dictionary 27A more than once to extract the extension characters and generate new substrings as will be explained hereinafter. The process of decoding in block 42 is thus a variable which in the prior art was required each time the string code Sp or an identical string code was decoded. In the present embodiment, the decoding of the string code Sp is shown at logic block 42. The decoded string Sp is outputted and stored as a string of characters at block 43 and may be added at logic block 44 into an auxiliary memory at the address pointer code address via line 45. Diagrammatically the decoded string Sp may be directed back to the string table 27A as the individual characters and stored in place of string Sp as will be explained in detail hereinafter. In one form of the present invention, the plural string of characters to be stored in memory via line 45 are detected as a start byte and length of characters as shown at block 46. This information is supplied to logic block 47 and used to write the length and start address in a finder memory at a pointer code address generated by a counter 35A as will be explained hereinafter when an auxiliary memory is used.

Figure 5:
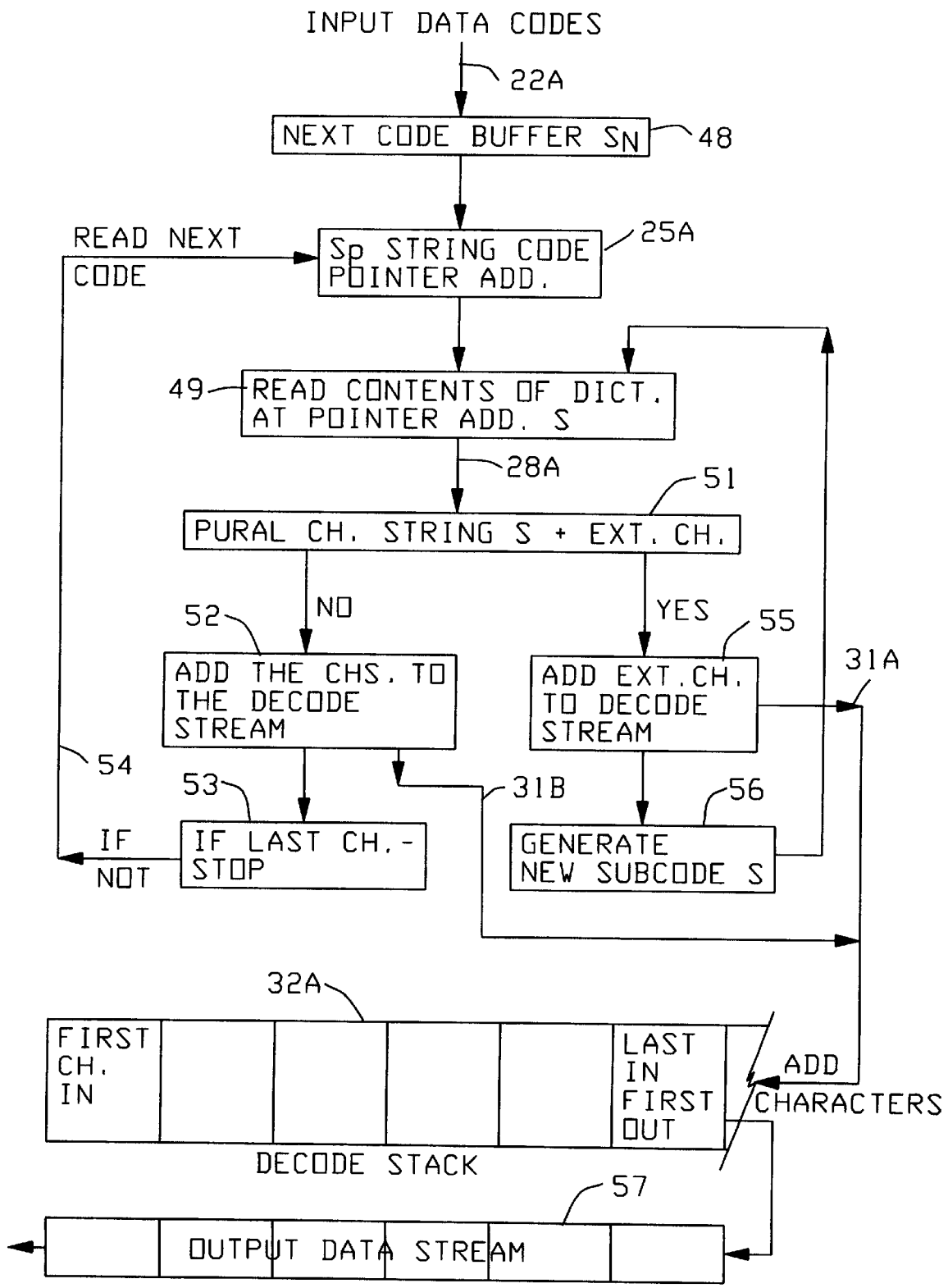
FIG. 5 is a flow diagram showing the process of building or generating a string of decoded characters from input data codes using the decoder dictionary shown in FIG. 4.

Refer now to FIG. 5 showing a flow diagram used to explain the process of building or generating a stream of decoded characters from input data codes using a decoder dictionary of the type shown in FIG. 4. The next input data codes Sn on line 22A are shown being inputted to a logic code buffer 48. The information in logic code buffer 48 is used to generate a previous pointer address Sp as shown in block 25A, similar to block 25 of FIG. 3. The pointer address Sp causes the contents of the dictionary 27 to be read out at the pointer address generated by the string Sp as shown at block 49. The output on line 28A is logically examined for the determination of whether it comprises a plural string S plus an extension character as shown at block 51. If S is a single character string the information is inputted to logic block 52 and the single character is outputted to the decoded string via line 31B and into the stack 32A. If this is the last character of string S as shown at block 53, the next string is ready for decoding. The information on line 54 loads the new code Sn into pointer address block 25A as a new Sp and the process starts over again. However, if block 51 senses a plural character string that comprises S plus an extension character, then the extension character is added to the decode stream as shown at block 55 via line 31A and into stack 32A. The string S is used to generate the next substring S code as shown at logic block 56. The contents of the dictionary 27 at the new substring S address are read into block 51.

Each extension character is loaded into the reverse stack 32A until the last character of S is in, then the information is reversed out of the stack 32A and put into the output data stream 57 in its proper order.

It will now be understood FIG. 5 shows that one logical way of decoding substrings is to take each of the known extension characters from the string dictionary 27 and put them in a stack. Once the stack is loaded with all the characters from a particular code Sp, then that information is reversed out of the stack and put into the output data string and the next Sp code may be decoded.

Figure 6:
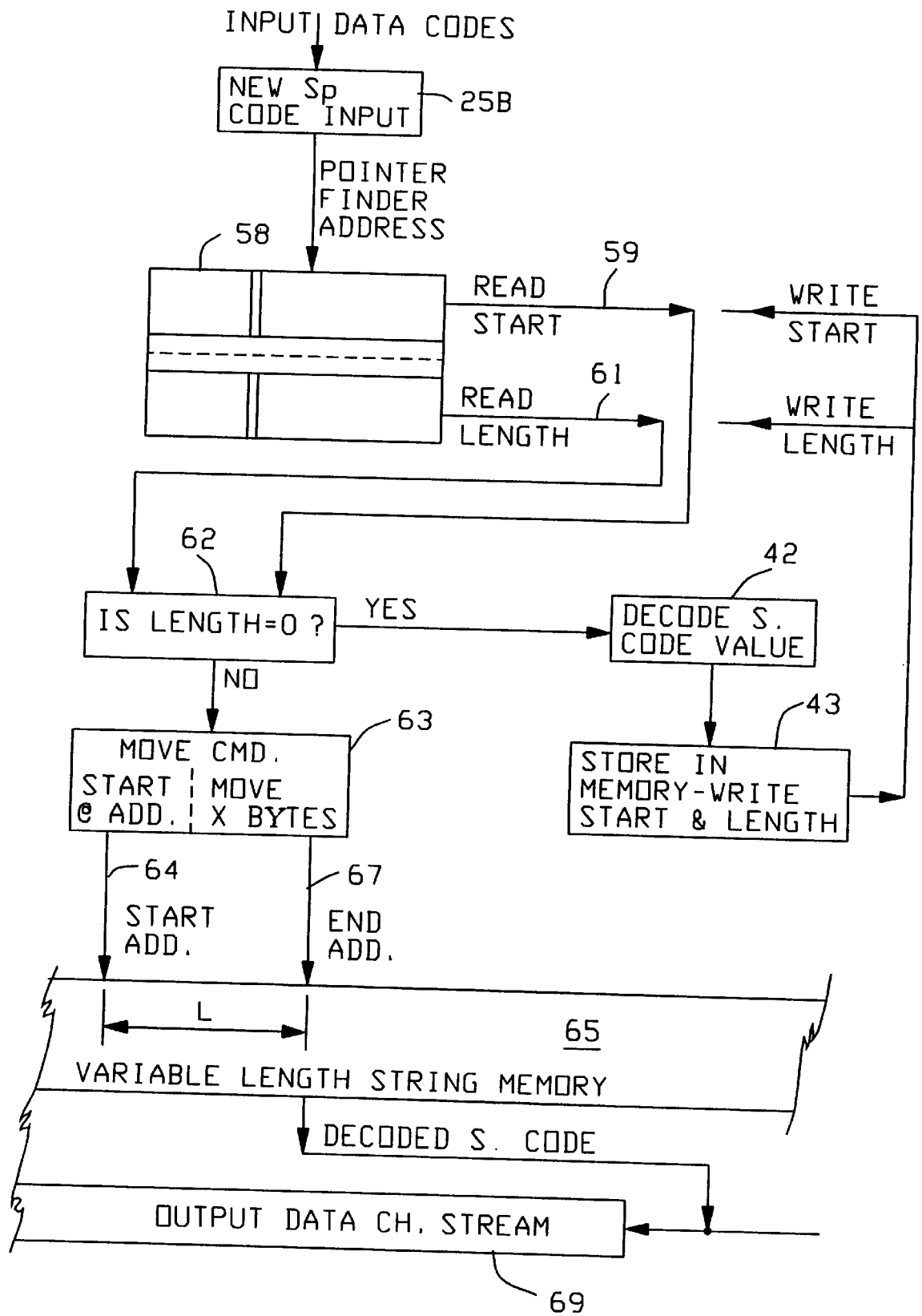
FIG. 6 is a schematic block diagram of a preferred embodiment decoder or decompression system for expanding incoming compressed data codes into blocks or strings of decoded characters in single recovery cycle.

Refer now to FIG. 6 showing a schematic block diagram of a preferred embodiment decoder in a decompression system for directly expanding compression data codes into strings or blocks of decoded characters in a single recovery cycle. The data codes Sp in block 25B are shown being used to generate a pointer address which points to an address location in the finder memory 58 which will be described in greater detail hereinafter. The information in this finder memory generates a read start address on line 59 and a length L value on line 61 which permits the logic to find an end address. The information on line 61 provides data indicating that the finder memory 59 has been loaded with information regarding the length of a block. The logic in block 62 determines if the length is equal to zero, and if not, data will be found in the associated memory. If the length is not zero, a move command is generated in block 63 to move a block of memory characters starting at the start address shown at line 64 and having a length L shown at L 66 and an end address shown at line 67. The decoded string Sp is read out of the variable length string memory 65. This memory may take any form in which a memory can transfer or move blocks of data having a length L. The decoded characters are shown being provided on line 68 directly into the output data character stream 69. It will be understood that blocks of information may be 8 bit characters and transferred in parallel as 8 bits into a series string or outputted directly in parallel format for a dump. Having explained the preferred embodiment method of directly reading decoded characters from a string memory it will be appreciated that only one continuous cycle was necessary to obtain all the characters instead of having to extract one character at a time as shown in the prior art decoder explained with reference to FIG. 3. The variable length memory 65 is diagrammatic and if the type of computer being used to move the information does not have a block transfer command it is possible to start at address 64 and continue to read out individual sequential addresses until the number of addresses in length 66 ends with the end address 67 and the same transfer or dump would be accomplished even though it would take longer than a variable length move command.

Figure 7:
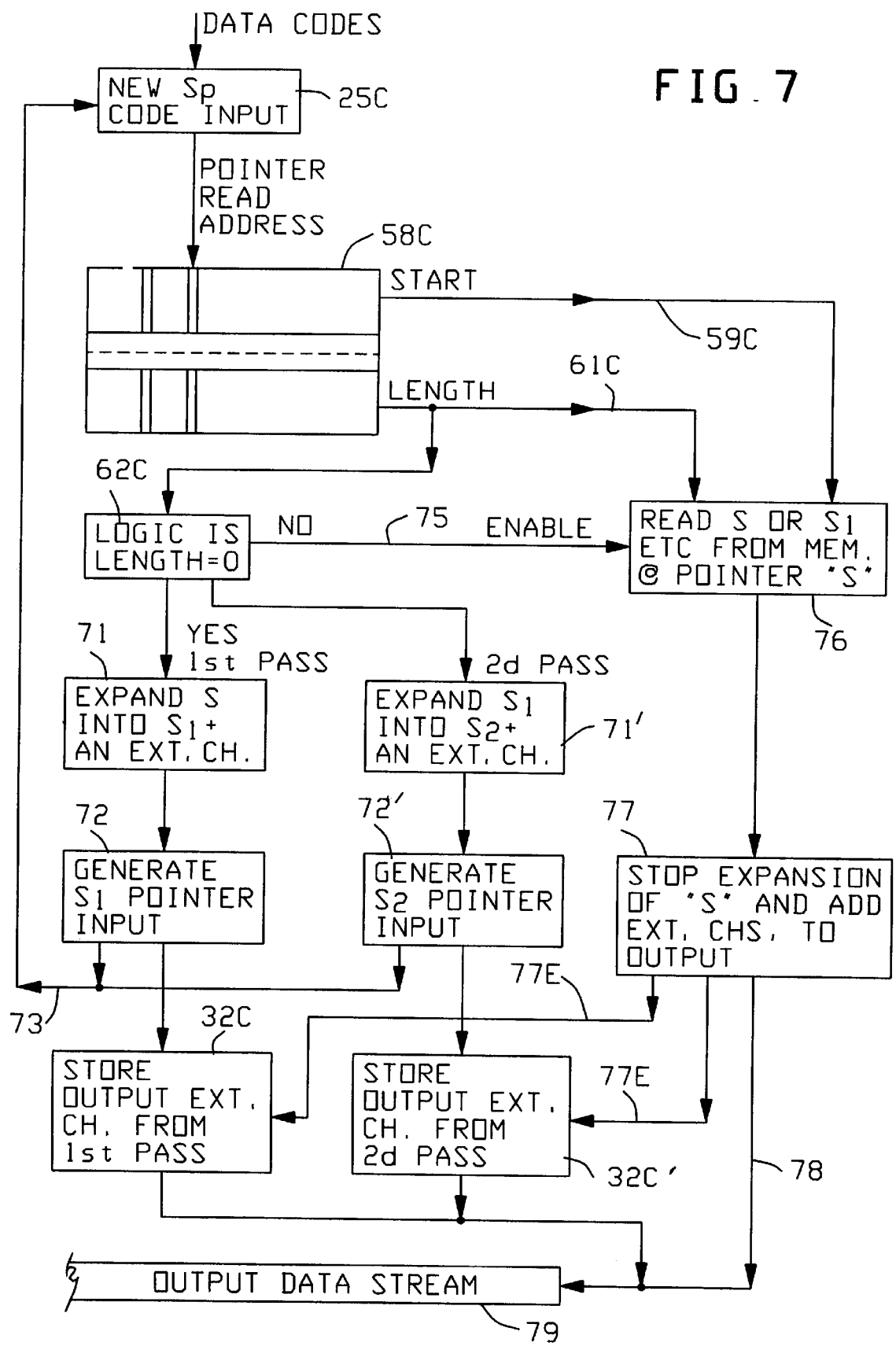
FIG. 7 is a schematic block diagram of a modified decoder or decompression system which will initially decode a long string code in a conventional manner until one of the remaining substring codes is decoded as a block or stream of characters.

Refer now to FIG. 7 showing a schematic block diagram of a modified decoder or decompression system which will initially decode a very long string code into substrings plus extension characters in a conventional manner until one of the remaining substrings can be decoded as a block or stream of characters. The reason for providing a modification of this type is that very long strings sometimes are unique to the data and would only occur once or twice in a huge data file. A string of this type written into the memory described in FIG. 6 could be accommodated but some types of memory are not so accommodating and the length of the string needs to be reduced to a size that is operable in the system used.

Data codes Sp are shown being inputted to the new string input buffer 25C which produces a pointer address to the finder memory 58C. When length data is outputted on line 61C to logic 62C, a conclusion may be made that the complete string is already recorded in the main memory. If the length is zero, then the string is not in the memory and the string must be expanded into substrings. The start of this expansion is shown in block 71 where the incoming string is expanded into a substring S1 plus an extension character. The substring S1 is used generate an S1 pointer input at logic block 72. The new pointer or new string S1 is inputted into the block 25C via line 73 to produce a new pointer corresponding to a substring of Sp. A second pass will be made through the system if the string is not in memory and starts with the expansion of S1 into a string S2 plus a new extension character at block 71'. A new pointer is generated at block 72' and is inputted into the pointer address generator 25C. Both blocks 72 and 72' output their extension character into buffer 32C and 32C' respectively where they are held until such time as an enable signal is produced line 75 indicating that it is no longer necessary to expand the string now loaded into block 25C. Logic block 76 then will read the block of information corresponding to the start address on line 59C and its length on line 61C from the memory shown and described in FIG. 6 or an equivalent thereof. The memory address pointer block 76 also outputs a signal to logic block 77 to cease expansion of the substrings and to add the characters read from a block of memory onto output line 78. An enable signal on lines 77E sequentially adds the extension characters from the second pass and then the first pass onto the output line 78 to produce the output data stream.

In summary, the decoder system shown in FIG. 7 will start by extracting the extension characters from the long string in reverse order until such time as it can produce a decoded string from a block memory to block 77 and then add in reverse order the extension characters previously extracted during the process of reducing the length of the original string code.

Figure 8:
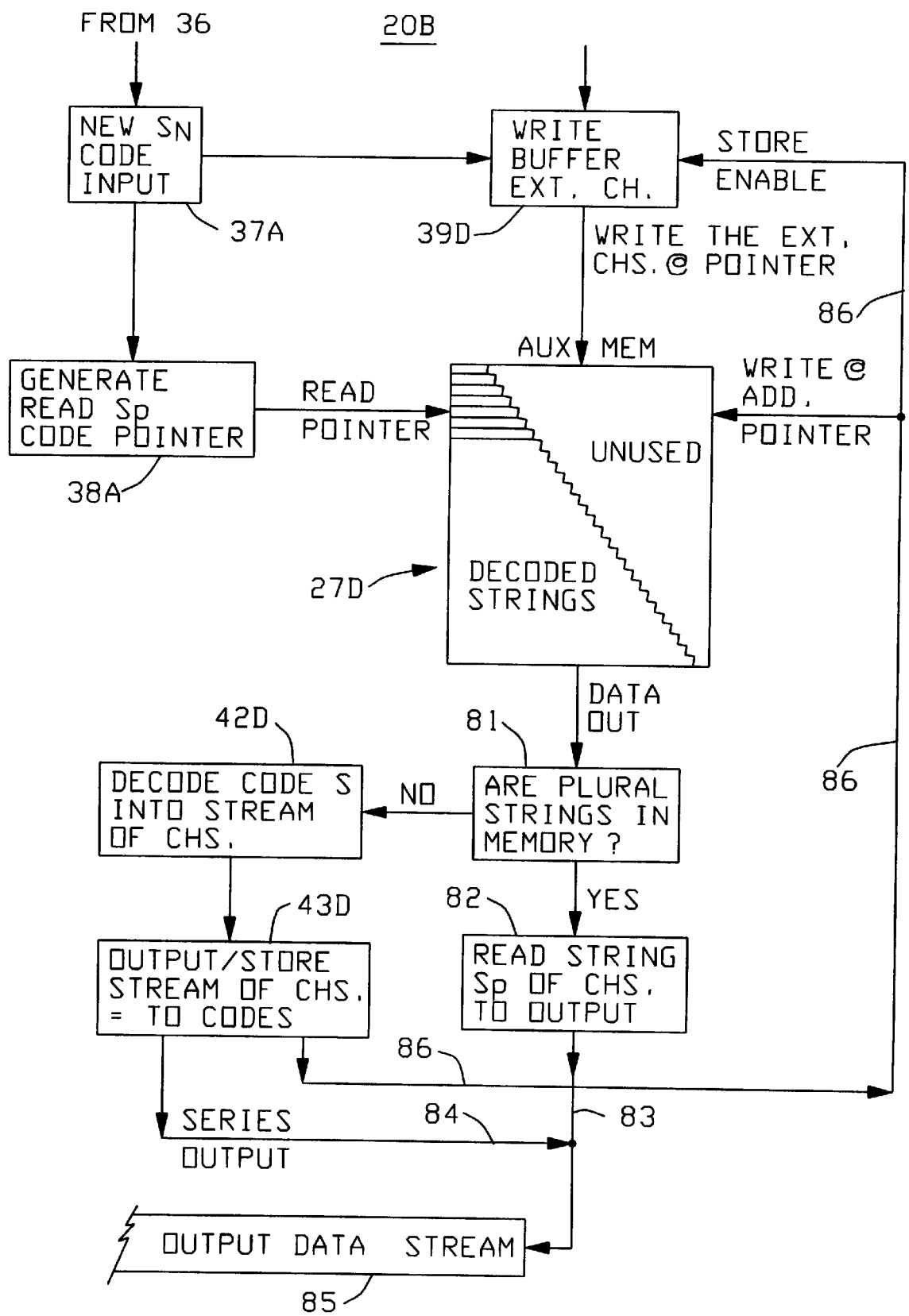
FIG. 8 is a schematic block diagram of another preferred embodiment decoder string dictionary for decoding incoming long strings and for decoding a first seen string code then storing the decoded characters in the decoder string dictionary.

Refer now to FIG. 8 showing a schematic block diagram of another preferred embodiment decoder/string dictionary for increasing the speed of decoding incoming long string codes and/or decoding a first seen string code and storing the decoded string in a dictionary. In this improved embodiment the new auxiliary memory or string dictionary 27D is employed to store only characters. Instead of storing Sp plus an extension character at an address code generated by the address counter, the whole string of characters representative of Sp are stored in the memory 27D.

The compressed codes are arriving at the decompressor 20B from data code stream 36 and are buffered in new code register 37A. The new string code Sn is loaded into previous code block 38A where it is used to generate a read pointer address for the string code Sp. As explained hereinbefore, there is enough information in dictionary 27A to decode Sp and to write Sp plus its extension character in the dictionary. If Sp is a previously seen code in the data stream it has already been decoded and written in the dictionary 27D. This can be detected at block 81 when the data at pointer Sp is read out. Block 82 can directly read out the decoded characters to the output data stream 84 via line 83.

If there is no data read from memory 27D at pointer Sp, then Sp is not yet in the dictionary and must be decoded for the first time. Logic block 42D decodes Sp for the first time and records and stores the output in buffer 43D in a proper form for output on line 84 to the output data stream 85.

The dictionary does not yet have decoded Sp stored as a prefix for a code value. The same information is supplied on line 86 and is written in the dictionary at the next counter address as explained with reference to FIG. 4 using the write address pointer code. When Sp is written into the memory/dictionary 27D it is in the form of decoded characters (decoded strings) and will be followed by an extension character from the string code Sn in block 37A. To accomplish this end a write buffer 39D is provided to extend the first character of the string Sn and write it in memory when enabled by line 86 as shown at the store enable input.

In summary, FIG. 8 complements FIG. 4 and describes a method of replacing Sp in the dictionary with a string of characters. When an Sp read pointer subsequently reads the contents of memory 27D it can ignore the extension character and output Sp alone.

As an alternative to reading and decoding Sp first and then storing a new Sp as characters, it is possible to build the dictionary first with Sp plus its extension character and then decode and replace Sp with its equivalent characters. Since the values for Sp are already in the dictionary as S plus an extension character it is also possible to output the characters for Sp before building the dictionary. Having explained several ways that an auxiliary memory or dictionary may be implemented, the order of the steps to accomplish this result may be varied.

Having explained how a large memory 27D can be employed to store decoded strings at read pointer addresses Sp it will be understood that only a portion of those strings occupy the rows of memory shown as decoded strings and the other portion to the right of the decoded strings represents unused memory. While memory is wasted, memory is cheap and time is valuable, thus the substitution of auxiliary memory 27D into a decoder of the type shown in FIG. 4 will greatly increase the speed of the decoder.

Figure 9:
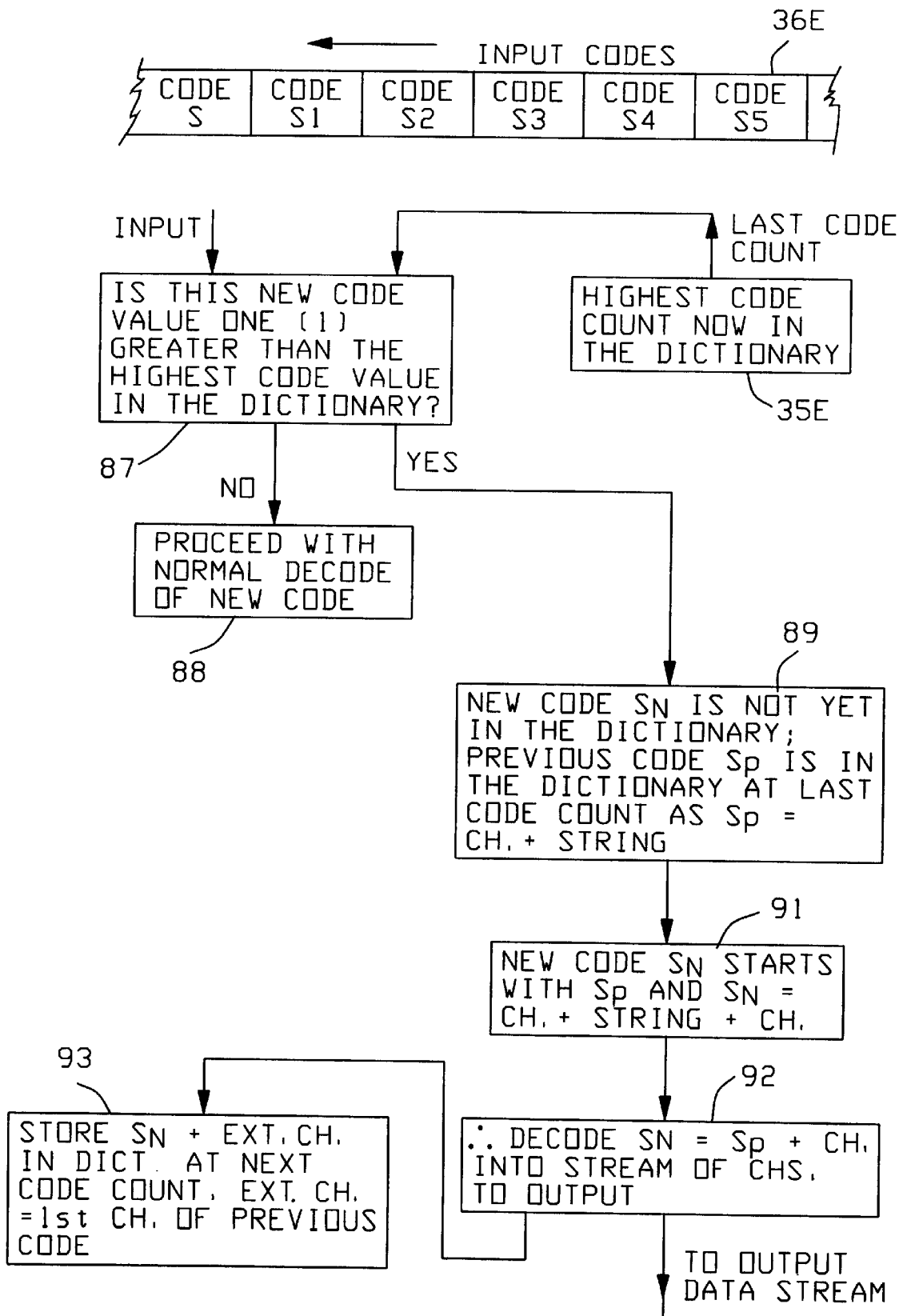
FIG. 9 in a schematic block diagram of a part of a preferred embodiment decoder system that will automatically recognize and decode input codes that are not decodable by a conventional process in the decoder system.

Refer now to FIG. 9 showing a schematic block diagram of a part of a preferred embodiment decoder system that automatically decodes input codes that are not decodable by a conventional process and string dictionary as explained hereinbefore. In the aforementioned Terry A. Welch article in IEEE, Computer, it was explained that there is an exception to the conventional decoding process when the string k S k S k appears at the input to the compressor and the string k S is already stored in the compressor string dictionary. The problem with the occurrence of this sequence of three characters and two strings is that the decompressor string dictionary does not already have a code value corresponding to the last input code. FIG. 9 represents a simplified way of treating with this condition and was not included in previous figures but is part of the system programmed into a computer (not shown) for carrying out the invention previously described.

The decompression input data stream 36E is shown comprising a series of numbered coded strings S through S5 and these particular strings are inputted into a logic block 87 which determines if the new string code received at block 87 has a value greater than the highest code value that is already written in the dictionary as produced by the code counter 35E. If the logic at block 88 determines that the new code inputted to logic 87 is in the dictionary, then proceed normally to decode the new code as explained hereinbefore with reference to FIGS. 4 through 6. If the new code is greater than the old code, then the logic in block 89 concludes that the new code Sn is not yet in the decompression dictionary. However, the previous code Sp is in the dictionary at the last code count and when decoded is equal to a first character plus a string. Logic block 91 produces the new code for Sn using the decoded value for Sp wherein Sn is equal to the character plus the string value for Sp plus the first character that started Sp appended to the end. Since the value for the new code Sn is now known, it is possible to decode Sn as a Sp code value from the dictionary and output a string of characters at the output as shown at block 92. Further, once the value for Sn is decoded as Sp it now may be stored in one of the dictionaries described hereinbefore as Sp plus an extension character in the dictionary at the next code value.

Having explained how the prior decoder decoded individual codes by taking off extension characters it will be understood that such codes were decoded in the reverse order in which they would appear in the output string. Accordingly, characters were placed in a stack where they could be retrieved in a last in first out (LIFO) order. Accordingly every long string was previously decoded using several cycles for each character in the string until the string was exhausted by substrings. The present invention decoder makes one simple determination as to whether the string has been seen before at the decoder, and if so, the decoded characters are available in a auxiliary memory or a block type memory and are decoded directly in a single cycle. It will be understood that the first time a string appears at the input of the present invention decoder and includes multiple substrings it must be decoded in a conventional or a semi-conventional manner and the decoded information be placed in a block transfer computer-type memory or in a high speed addressable memory. The decoded strings are read out of the memory the second time they appear. Very long strings include a large number of substrings which would ordinarily consume an inordinately large memory using the embodiment shown in FIG. 8. However, by decoding the first and second substrings, underlying substrings are usually found in the direct or auxiliary memory 27D as explained hereinbefore.

It is possible that the auxiliary memory can be made so large that all normal strings would appear as decoded strings once encountered in the input data string. However, using the modified system shown in FIG. 8, when the full string is not in memory, it can be conventionally decoded and placed in an addressable memory. The modified system does not hang up because an abnormal string exceeds the capacity of the allotted memory.

One of the advantages to direct decoding of input codes from a compressor at high-speeds is that the information need not be buffered in memories and then decoded because it can be decoded in real time as the information comes in even when the information represents graphics information in the form of pixel data. The present invention can be used to download pages from catalogues and books in real time. If the present invention is incorporated with other known compression picture formats it will be possible to achieve video frame format speed at the decompressor.

What is claimed is:

1. A data decompression method for recovering a stream of individual data characters from a stream of coded signals representing strings of said individual data characters, said method comprising the steps of:

receiving said coded signals in pairs representing said strings as a previous string Sp and a next string Sn, storing in a decoder dictionary the characters representative of the previous string Sp extended by the first character of the next string Sn, said step of storing comprising storing the characters for said previous string code and its next or extension character at a code address corresponding to the next unused string code, decoding said received previous string code Sp into individual characters by reading extension characters and outputting extension characters from a memory, storing said decoded individual extension characters at a memory address accessible by said next unused string code, and subsequently accessing said memory address using said next unused string code to obtain said decoded individual data characters without again decoding said previous string code.

2. A data decompression method as set forth in claim 1 wherein the step of storing said decoded individual characters comprises storing said data characters in a variable length memory as bytes of data characters.

3. A data decompression method as set forth in claim 2 wherein said variable length memory comprises a block of memory accessible by a start address and a length defining a block of memory.

4. A data decompression method as set forth in claim 3 which further includes the step of storing said start address and said length of a finder memory.

5. A data decompression method as set forth in claim 4 wherein said step of subsequently accessing said memory address to obtain said decoded individual characters comprise moving a block of L length memory starting at a start address.

6. A data decompression method as set forth in claim 5 which further includes reading the length L of said block in memory, and determining from length data read from memory that said decoded individual data characters are stored at a memory address accessible at said start address having a block length L.

7. A data decompression method as set forth in claim 1 wherein said step of storing said decoded individual data characters at a memory address accessible by said previous string code comprises storing all of said data characters at one code address for said previous string code.

8. A data decompression method as set forth in claim 7 wherein said code address used to access said previous string comprises a code address which includes the previous string of characters plus an extension character.

9. A data decompression method as set forth in claim 7 which further includes the step of directly outputting into a decoded output data stream all said individual characters representing a previous code.

10. A data decompression method as set forth in claim 7 wherein said step of decoding said previous string into individual data characters further includes accumulating said decoded characters in a buffer register and outputting said decoded individual data characters from a buffer.

11. A data decompression method for recovering from a stream of incoming compressing string codes the individual characters represented by said stream of string codes, comprising the steps of:

building a decompression dictionary of string code values used by a compressor to generate said stream of incoming string codes, decoding each new compressed string code as it is received at the decompressor, storing said decoded string code values in a memory accessible by an address pointer comprising said new string code while building said decompression dictionary, subsequently retrieving all individual stored characters representative of said string codes using an address pointer, and adding said retrieved individual characters to an output data stream.

12. A data decompression method as set forth in claim 11 which further includes the step of recording said output data stream in a computer having a display memory.

13. A data decompression method as set forth in claim 12 which further includes the step of displaying said data stream on a display of said computer in real time.

14. A data decompression method as set forth in claim 12 which further includes the step of storing said output data stream in a fast memory for future display.

15. A data decompression system for recovering from a stream of incoming compressed string codes the individual characters represented by said stream of code signals corresponding to strings of data characters, comprising:

a computer having an input for receiving and storing sequential pairs of said string codes, said pairs of codes representing a previous string code Sp followed by a new string code Sn, a code counter for generating addresses, a string dictionary for storing Sp and an extension first character of said new string Sn at a code counter address for the string Sn, means for decoding the code value Sn by reading stored decoded characters from said memory, means for storing the decoded value Sp as a stream of individual characters at the address for Sn in a memory, and means for retrieving said stream of individual characters from said memory in response to a string code received at the input to said computer.

16. A data decompression system as set forth in claim 15 wherein said string code received at the computer input comprises a substring code corresponding to a previously decoded string Sp.

17. A data decompression system as set forth in claim 15 which further includes a finder memory for receiving a string code and generating a block address for a variable length memory.

18. A data decompression system as set forth in claim 17 which further includes means for determining if said received string code has been previously decoded.

19. A data decompression system as set forth in claim 15 which further includes means for generating code address pointers for code values being received at the input to said computer, said means for decoding the code value Sp further includes means for generating substrings for the value Sp, and said means for retrieving said stream of individual characters further includes means for retrieving a stream of characters corresponding to one of said substrings.

20. A data decompression system as set forth in claim 15 wherein said memory for storing said decoded value of Sp comprises the string memory of said string dictionary.

* * * * *